United States Patent
Nagaya et al.

(10) Patent No.: US 7,763,543 B2
(45) Date of Patent: Jul. 27, 2010

(54) METHOD FOR MANUFACTURING SILICON CARBIDE SEMICONDUCTOR APPARATUS

(75) Inventors: Masatake Nagaya, Seto (JP); Yuuichi Takeuchi, Obu (JP); Katsuhiro Nagata, Nishikamo-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/289,413

(22) Filed: Oct. 28, 2008

(65) Prior Publication Data

US 2009/0124060 A1 May 14, 2009

(30) Foreign Application Priority Data

Nov. 13, 2007 (JP) ............... 2007-294163

(51) Int. Cl.
*H01L 21/311* (2006.01)

(52) U.S. Cl. ............ 438/700; 438/712; 438/692; 438/931; 257/E21.055; 257/E21.127; 257/E21.218; 257/E21.229; 257/E21.304; 257/E21.546

(58) Field of Classification Search ........... 438/692, 438/700, 706, 712, 746, 931; 257/E21.055, 257/127, 218, 229, 304, 546

See application file for complete search history.

(56) References Cited

U.S. PATENT DOCUMENTS

| | | | | |
|---|---|---|---|---|
| 5,816,900 A | * | 10/1998 | Nagahara et al. | 451/285 |
| 5,997,392 A | * | 12/1999 | Chamberlin et al. | 451/446 |
| 6,735,231 B2 | * | 5/2004 | Ono et al. | 372/45.013 |
| 6,835,120 B1 | * | 12/2004 | Matsui | 451/41 |
| 7,129,110 B1 | | 10/2006 | Shibata | |
| 7,393,790 B2 | * | 7/2008 | Britt et al. | 438/692 |
| 7,485,962 B2 | | 2/2009 | Nakagawa et al. | |
| 7,589,000 B2 | * | 9/2009 | Kasai et al. | 438/478 |
| 2007/0184646 A1 | | 8/2007 | Nakagawa et al. | |
| 2007/0287282 A1 | | 12/2007 | Nakagawa et al. | |

FOREIGN PATENT DOCUMENTS

| | | |
|---|---|---|
| JP | A-10-144638 | 5/1998 |
| JP | A-2002-270559 | 9/2002 |
| JP | A-2006-032655 | 2/2006 |

OTHER PUBLICATIONS

Notification of Reason for Refusal of Jan. 22, 2010 in the corresponding Japanese patent application No. 2007-294163 (and English translation).

Office Action mailed Oct. 13, 2009 from the Japan Patent Office in corresponding patent application No. 2007-294163 (and English translation).

Z.J. Pei, et al., "A grinding-based manufacturing method for silicon wafers: an experimental investigation," *International Journal of Machine Tools & Manufacture*, pp. 1140-1151, (2005).

Office Action dated Nov. 17, 2009 in the corresponding Swedish patent application No. 0802294-9 (and English translation).

\* cited by examiner

*Primary Examiner*—David Nhu
(74) *Attorney, Agent, or Firm*—Posz Law Group, PLC (57) ABSTRACT

A method for manufacturing a silicon carbide semiconductor apparatus is disclosed. According to the method, an element structure is formed on a front surface side of a semiconductor substrate. A rear surface of the semiconductor substrate is grinded or polished in a direction parallel to a flat surface of a table. A front surface of the semiconductor substrate is grinded and polished in a direction parallel to the rear surface after the rear surface of the semiconductor substrate is grinded or polished.

11 Claims, 4 Drawing Sheets

METHOD FOR MANUFACTURING SILICON CARBIDE SEMICONDUCTOR APPARATUS

CROSS REFERENCE TO RELATED APPLICATION

The present application is based on Japanese Patent Application No. 2007-294163 filed on Nov. 13, 2007, the disclosure of which is incorporated herein by reference.

BACKGROUND OF THE INVENTION

1. Field of the Invention

The present invention relates to a method for manufacturing a silicon carbide semiconductor apparatus.

2. Description of Related Art

A method for polishing an SiC wafer has been proposed in, for example, JP-A-2006-121111 (corresponding to U.S. Pat. No. 6,835,120) and JP-A-H10-144638. Specifically, JP-A-2006-121111 discloses a polishing apparatus, in which a polishing cloth is attached to a polishing platen, and a wafer holding table is located above the polishing cloth. An SiC wafer is placed on the polishing cloth, and placed between the polishing cloth and the wafer holding table.

The polishing apparatus can be used as follows. Such an SiC wafer is prepared that a trench is formed in one surface of the SiC wafer and a trench filling layer is formed in the trench. A groove formed in a surface portion of the trench filling layer is flattened and eliminated.

In the above operation, the SiC wafer is interposed between the polishing cloth and the wafer holding table so that the trench filling layer of the SiC wafer faces the polishing cloth. The wafer holding table and the polishing platen are respectively rotated while a chemical solution including abrasive grains is being dropped from an injector located above the polishing cloth. Thereby, a surface portion of the trench filling layer of the SiC wafer is flattened and polished while the SiC wafer is being pressed to the polishing cloth by the wafer holding table.

JP-A-H10-144638 discloses the followings. A pattern for step adjustment is disposed in a periphery of an element region of a semiconductor wafer to flatten irregularities on a film surface. The film surface is target for planarization by polishing or grinding. Thereby, a pressure in grinding or polishing can become constant, and planarizing is uniformly performed.

Since an SiC wafer is hard next to diamond, even if an oxidation film that functions as stopper is disposed on an SiC wafer, the oxidation film is abraded prior to the SiC wafer. Accordingly, in planarizing and polishing an SiC wafer, it is difficult to selectively polish the SiC wafer by using an oxidation film that functions as a stopper. Thus, the planarizing will be performed without using the oxidation film that functions as a stopper.

When the groove of the trench filling layer of the SiC wafer is attempted to be flattened by using the polishing apparatus according to the JP-A-2006-121111, if a step exists on one surface of the SiC wafer, it is difficult to planarize the one surface with high accuracy.

Even when a pattern for step adjustment is disposed in a periphery of an element region of a semiconductor wafer in such a manner as disclosed in JP-A-H10-144638, if a semiconductor wafer to be grinded or polished is hard one (e.g., SiC wafer), it is difficult to abrade the SiC wafer so that a step on a surface of the SiC wafer is made small. The above difficulty is similar to the case associated with JP-A-2006-121111.

Moreover, the planarizing of an SiC wafer only by polishing according to the above manners results in the SiC wafer having a periphery portion that is polished more than a center portion. It is difficult to planarize the SiC wafer uniformly.

SUMMARY OF THE INVENTION

In view of the above and other difficulties, it is an objective of the present invention to provide a method for manufacturing an SiC semiconductor apparatus, the method provides an SiC wafer planarized with high accuracy.

According to a first aspect of the present invention, a method for manufacturing a silicon carbide semiconductor apparatus is provided. The method includes: preparing a semiconductor substrate made of silicon carbide, having a plate shape, and having a front surface and a rear surface; forming an element structure on a front surface side of the semiconductor substrate; placing the semiconductor substrate on a table having a flat surface, so that the front surface of the semiconductor substrate faces the flat surface of the table, after the element structure is formed; grinding or polishing the rear surface of the semiconductor substrate in a direction parallel to the flat surface of the table; grinding and polishing the front surface of the semiconductor substrate in a direction parallel to the rear surface after the rear surface of the semiconductor substrate is grinded or polished.

According to the above method, it is possible to planarize the front surface and the rear surface of the semiconductor wafer with high accuracy.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Exemplary Embodiment

As a related art, referring to FIGS. 6A and 6B, explanation is given below on reasons why, if a step exists on the surface of the SiC wafer, it is difficult to planarize a surface of an SiC wafer with high accuracy in such a manner as disclosed in JP-A-2006-121111.

Figure 6A:
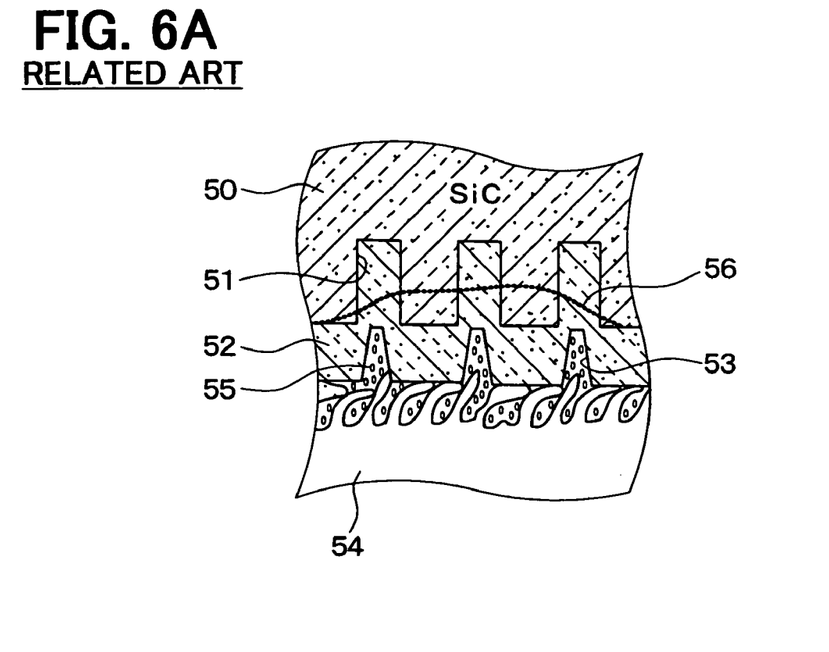
FIGS. 6A and 6B are explanatory diagram associated with polishing a surface of an SiC wafer in accordance with the related art.
Figure 6B:
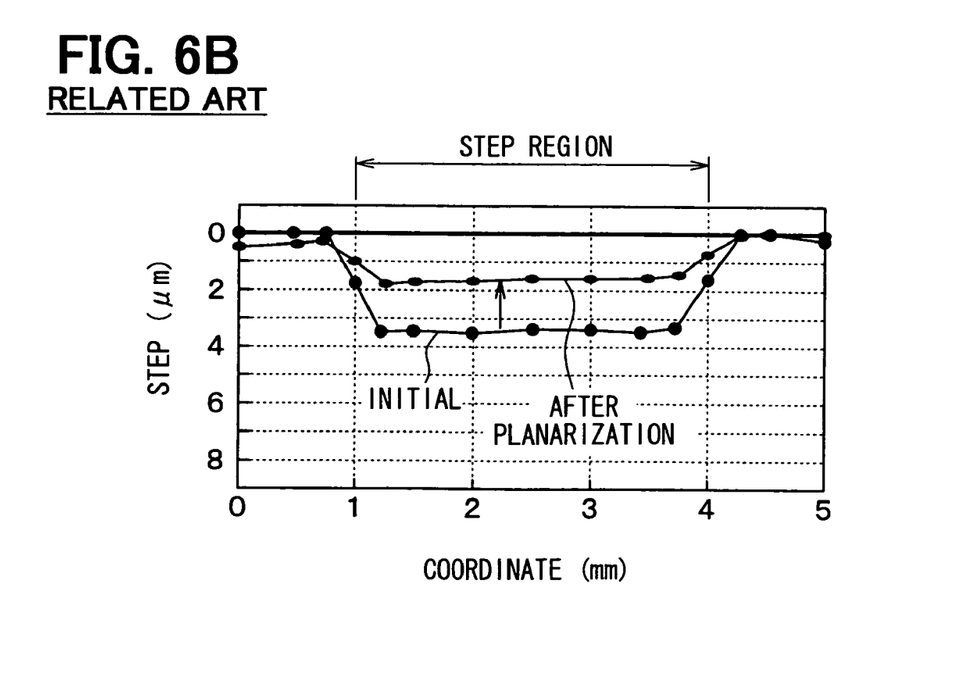

As shown in FIG. 6A, a trench 51 is formed in one surface of a SiC wafer 50. A trench filling layer 52 is formed so as to fill in the trench 51. When the trench filling layer 52 is flattened, abrasive grains located between the polishing cloth and the trench filling layer 52 can abrade the groove.

When the SiC wafer 50 has a step region, which is indicated by a dashed line in FIG. 6A, the planarization is made along the step region. Since the surface and the step are made of the same SiC, it is difficult to selectively remove and flatten a groove that has not a stopper film. Also, when the polishing is performed by using a hard polishing cloth or the like, a damaged layer is left. After the planarizing, it is required to perform polishing again by using a soft polishing cloth. When the polishing is again performed by using the soft polishing cloth, even if the trench filling layer 52 located on the SiC wafer 50 is abraded, it is difficult to abrade the SiC wafer 50 so that the step is made smaller, as shown in FIG. 6B. Also, when the step is attempted to be eliminated, thinning or dishing may take places to form a recess in the SiC wafer. Accordingly, it is difficult to achieve planarization with high accuracy. In view of the above and other difficulties, exemplary embodiments according to the present invention are presented below.

First Embodiment

Figure 1A:
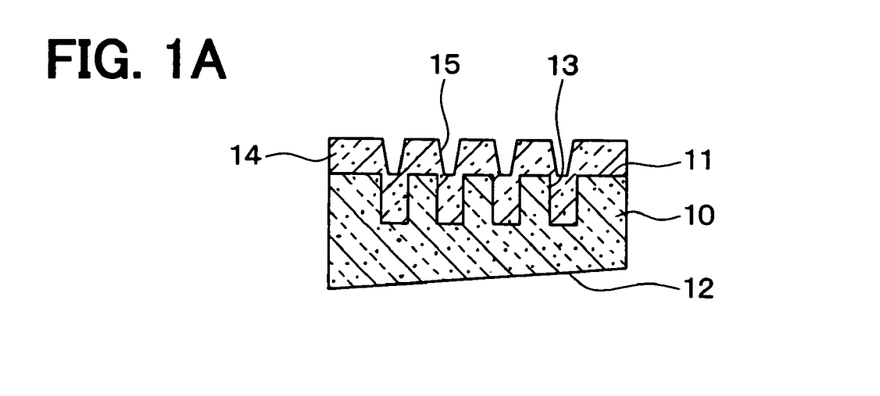
FIGS. 1A to 1C are cross sectional diagrams illustrating manufacturing processes of a silicon carbide semiconductor apparatus in accordance with a first embodiment.
Figure 1B:
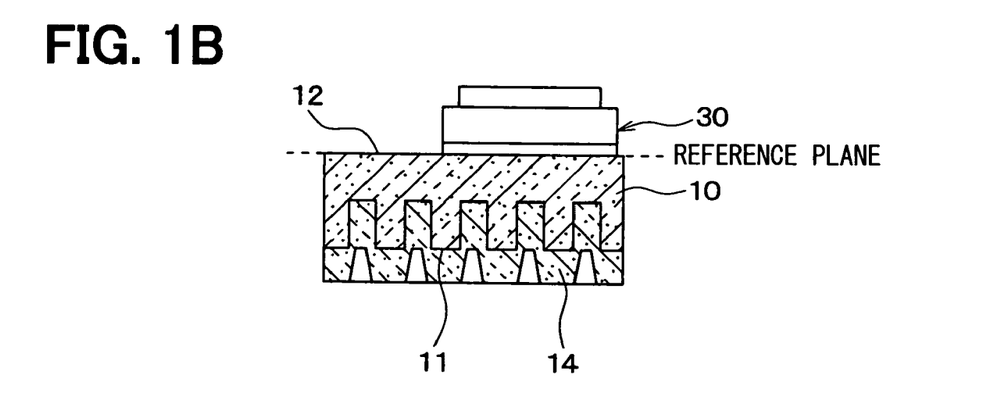
Figure 1C:
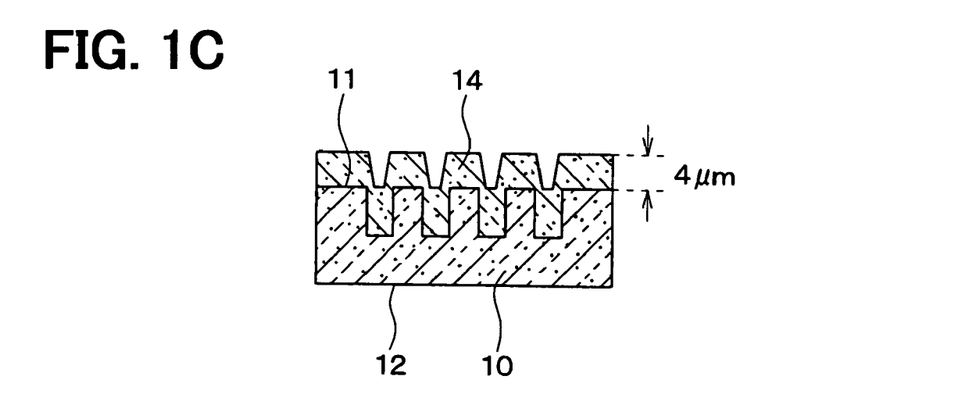
Figure 2A:
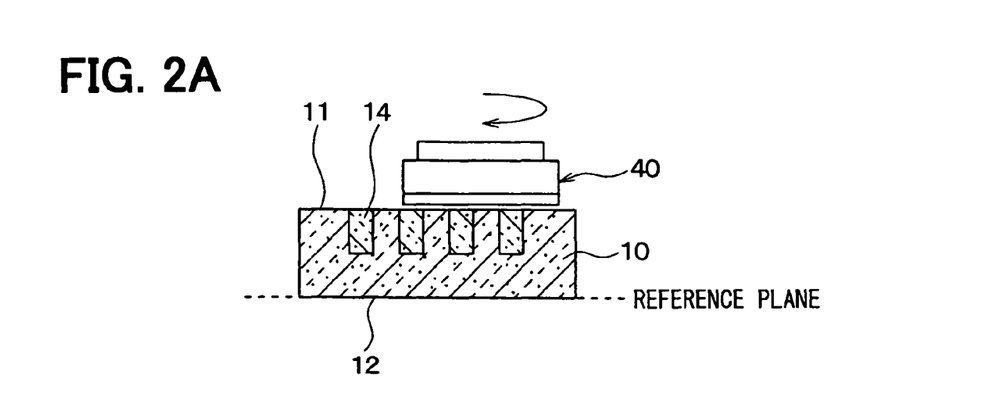
FIGS. 2A and 2B are cross sectional diagrams illustrating manufacturing processes of the silicon carbide semiconductor apparatus, the processes being performed subsequent to those illustrated in FIGS. 1A to 1C.
Figure 2B:
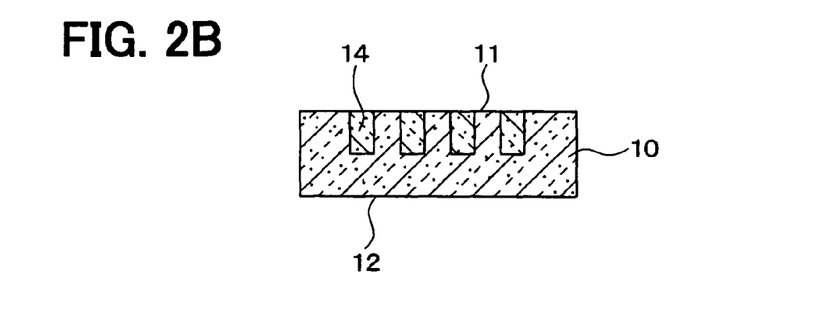

A first embodiment according to the present invention is described below with reference to the drawings. FIG. 1 and FIG. 2 are cross sectional diagrams illustrating manufacturing processes of an SiC semiconductor apparatus in accordance with the present embodiment. Referring to the above FIGS. a method for manufacturing the SiC semiconductor apparatus according to the present embodiment is explained.

An SiC wafer 10 is provided by sublimating SiC powder, re-crystallizing the sublimated SiC and growing a seed crystal to form a bulk single-crystal SiC, cutting the bulk single-crystal SiC into a wafer shape, and mirror-finishing a front surface 11 (i.e., cutting plane) of the wafer. An SiC layer or a GaN layer is epitaxially grown on the front surface 11, and then, a device is formed. In order to obtain an epitaxial layer with high crystallinity, the front surface 11 of the SiC wafer 10 is required to be substantially free from defects and be substantially smooth at an atomic level.

In the present disclosure, the SiC wafer 10 corresponds to a semiconductor substrate.

Then, a process of forming a semiconductor device is performed. In the process, a semiconductor device is formed on the front surface 11 of the SiC wafer 10.

Specifically, as shown in FIG. 1A, a trench 13 is formed on a front surface 11 side of the SiC wafer 10 by dry-etching such as reactive ion etching (RIE) or the like. Then, a trench filling layer 14 is formed in the trench 13. The trench 13 is for an element having a trench filling structure.

The trench filling layer 14 may be formed by, for example, epitaxial growth. The trench filling layer 14 may have a conductivity type different from that of the substrate. The trench filling layer 14 may have impurity concentrations that vary continuously. Such filling layers can vary according to desired semiconductor elements.

When the trench filling layer 14 is formed in this process, a surface of the trench filling layer 14 has a morphology originating from a shape of the trench 13. That is, a groove 15 is located on a surface of the trench filling layer 14. A structure formed on the surface of the SiC wafer 10 is, for example, the trench 13, the trench filling layer 14, the groove 15 of the trench filling layer 14, or the like. Such a structure corresponds to an element structure in the present disclosure.

Then, as shown in FIG. 1B, a rear surface 12 of the SiC wafer 10 is grinded or polished. In forming the trench filling layer 14 as described above, the trench filling layer 14 is formed so as to extend from the front surface 11 to the rear surface 12 of the SiC wafer 10.

As shown in FIG. 1A, the rear surface 12 of the SiC wafer 10 is not parallel to the front surface 11. Thus, a difference TTV (total thickness variation) between maximum thickness and minimum thickness of the SiC wafer is large. Accordingly, as shown FIG. 1B, a grinder 30 having a cylindrical shape is rotated and moved by a driving mechanism (not shown). Thereby, the rear surface 12 of the SiC wafer 10 is grinded or polished to form a reference plane used for planarizing the front surface 11 of the SiC wafer 10. Since the front surface 11 side of the SiC wafer 10 is to be abraded later, the rear surface 12 is abraded parallel to the front surface 11 with reference to the front surface 11.

A grinding wheel having a cup shape can be used as the grinder 30. The grinding wheel having a cup shape has a grinding surface that is located at an open end of a case. Alternatively, a straight cup shaped wheel, a tapered cup shaped wheel, a bowl shaped wheel or the like can be used as the grinding wheel having a cup shape.

The whole rear surface 12 of the SiC wafer 10 is grinded or polished by changing a grain size of the grinder 30. Thereby, the rear surface 12 of the SiC wafer 10 is grinded or polished in a direction parallel to a flat surface and the rear surface 12 of the SiC wafer 10 can be adopted as a reference plane.

The rear surface 12 of the SiC wafer 10 is grinded or polished through the above manners, and thereby, it is possible to remove an unwanted film, which is formed in a device process and which extends to the rear surface 12 of the SiC wafer 10. Further it is possible to set a difference TTV between the rear surface 12 of the SiC wafer 10 and the surface of the trench filling layer 14 to TTV$\leqq$1 μm.

As shown in FIG. 1C, a portion of the trench filling layer 14 has a thickness of, for example, 4 μm with respect to the front surface 11 of the SiC wafer 10. In a subsequent process, the portion of the trench filling layer 14 located above the front surface 11 of the SiC wafer 10 is grinded, and a step on the front surface 11 of the SiC wafer 10 is removed.

As shown in FIG. 2A, a grinding process is performed using super-fine abrasive grains having a grain size of, for example, #8000, so that the trench filling layer 14 located above the front surface 11 of the SiC wafer 10 is removed. In the above case, the trench filling layer 14 is grinded in, for example, such a manner that the grinder 40 having a cylindrical shape is pressed to the front surface 11 of the SiC wafer 10 while the grinder 40 having a cylindrical shape is being rotated. According to the above manners, when a step is located on the front surface 11 of the SiC wafer 10, the SiC wafer 10 as well as the trench filling layer 14 is grinded. The front surface 11 of the SiC wafer 10 is grinded in a direction parallel to the rear surface 12. In the present embodiment, the grinding process is performed using super-fine abrasive grains #8000 until the step becomes smaller than 1 μm, the step smaller than 1 μm causing little influence in a subsequent chemical mechanical polishing (CMP) process.

Figure 3:
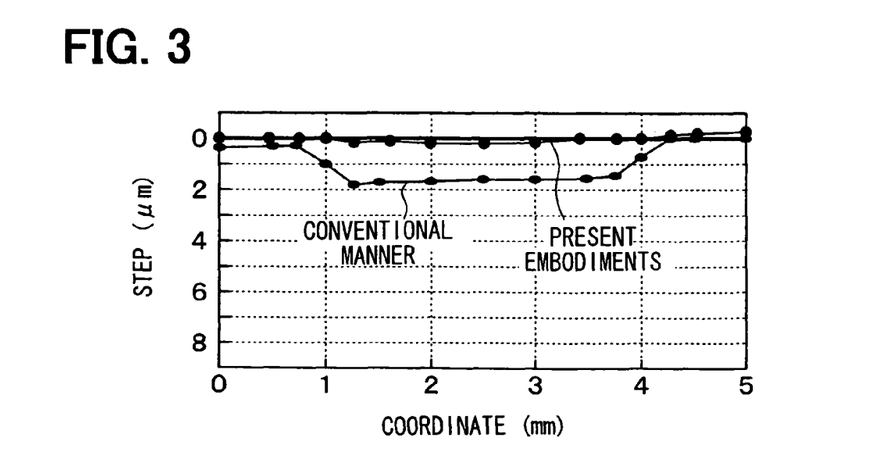
FIG. 3 is a graph showing a remnant step on a surface of an SiC wafer after the surface is planarized.

FIG. 3 is a graph showing a remnant step on the front surface 11 after the front surface 11 of the SiC wafer 10 is planarized. As shown in FIG. 3, according to a conventional manner, there is a step left after the front surface 11 of the SiC wafer 10 is planarized. According to the present embodiment, however, there is little step left, and further, a surface roughness of the front surface 11 of the SiC wafer 10 is 2 nm. This is because it is possible to reliably remove a convex portion of the front surface 11 of the SiC wafer 10 with reference to the reference plane since and because the reference plane is the rear surface 12 of the SiC wafer 10, the rear surface 12 which has been grinded in a direction parallel to the flat plane.

After the front surface 11 of the SiC wafer 10 is grinded in the above manners, the mirror-finished front surface 11 of the SiC wafer 10 can be inspected by using, for example, a makyoh. Thereby, it is possible to check whether the whole of the front surface 11 is grinded and whether there is a step left.

Then, as shown in FIG. 2B, a crushed layer is removed by chemical mechanical polishing (CMP), the crushed layer which is formed on the front surface 11 of the SiC wafer 10 in grinding as shown in FIG. 2A. A damaged layer, which causes degradation of an electric property of the semiconductor element from the front surface 11, is removed. In the above case, minute removal amount control that involves, for example, a capacitance-voltage (C-V) measurement method is employed. The minute removal amount control is performed through the following manners. A small piece of the crushed layer is abraded. It is electrically determined by C-V measurement method whether it is abraded. A removal rate is calculated. In accordance with the removal rate, the crushed layer on the front surface 11 of the SiC wafer 10 is removed, and the front surface 11 of the SiC wafer 10 is polished. In the present embodiment, in order to obtain an electric property of the semiconductor element, the CMP process is performed so that a removal amount due to the CMP process corresponds to 0.1 µm to 1 µm.

Through the above manners, the planarization of the front and rear surfaces of the SiC wafer 10 is completed.

Figure 4:
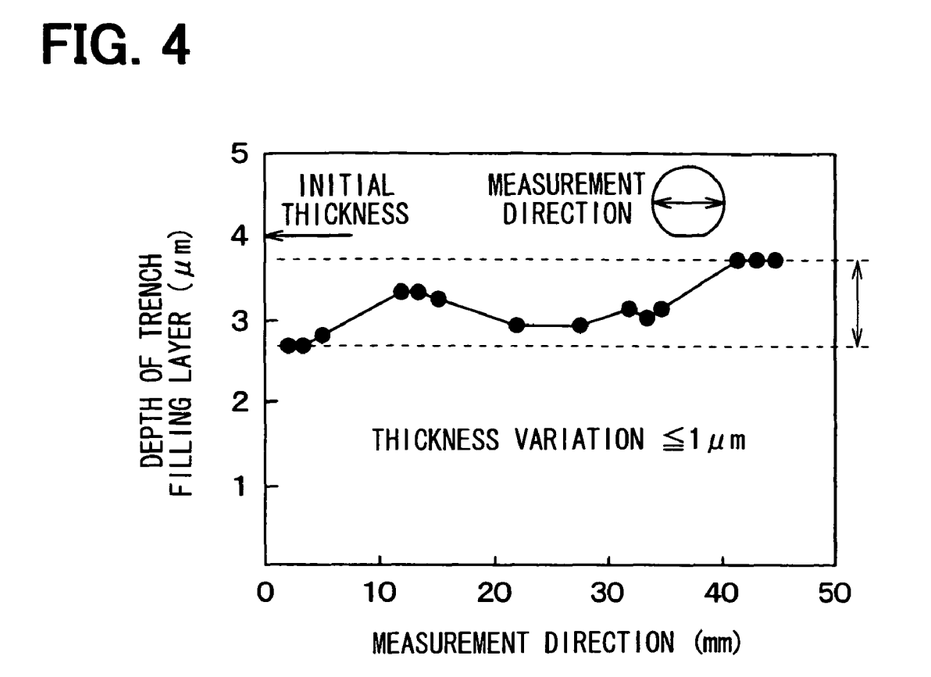
FIG. 4 is a graph showing a depth of a trench filling layer in one direction of an SiC wafer.

The inventors has studied a thickness variation of the trench filling layer 14 in a direction parallel to an orientation flat of the SiC wafer 10. FIG. 4 shows results. As shown in FIG. 4, a filling depth of the trench filling layer 14 corresponding to a depth of the trench 13 is in a range between 4.35 µm and 5.65 µm. The thickness variation of the trench filling layer 14 is less than or equal to 1 µm. The results also show that the front surface 11 of the SiC wafer 10 is grinded and polished with high accuracy.

Then, a protection film, an electrode and the like are formed on the front surface 11 of the SiC wafer 10. An electrode or the like is formed on the rear surface 12. Then, the SiC wafer 10 is divided into individual chips by dicing-cut. Through the above manners, the silicon carbide semiconductor apparatus is completed.

The performing of the above processes is referable to parallel the rear surface 12 with reference to the front surface 11 of the SiC wafer 10. The rear surface 12 of the SiC wafer 10 is paralleled by grinding the rear surface 12. If the rear surface 12 is not paralleled, the front surface 11 side can be nonuniformly processed, and it becomes difficult to uniformly flatten a small surface step less than or equal to 5 µm. In order to minimize process variation of the groove 15 of the trench filling layer 14, degree of parallelization in grinding the rear surface 12 is required to be less than or equal to 1 µm. The grinding process easily controls the degree of parallelization.

According to the present embodiment as described above, the rear surface 12 of the SiC wafer 10 is planarized parallel to the flat surface before the trench filling layer 14 located on the front surface 11 side of the SiC wafer 10 is planarized. Then, the front surface 11 side of the SiC wafer 10 is planarized parallel to the rear surface 12 of the SiC wafer 10.

Accordingly, in grinding and polishing the front surface 11 of the SiC wafer 10, the grinding and the polishing can be performed in a direction parallel to the planarized rear surface 12. Therefore, it is possible to grind and polish the front surface 11 so that the step on the front surface 11 side of the SiC wafer 10 is eliminated.

In the above case, the polishing is performed not along the step of the front surface 11 of the SiC wafer 10 but the grinding and polishing are performed by using super-fine abrasive grains in a direction parallel to the rear surface 12 that is the reference plane of the SiC wafer 10. It is therefore possible to planarize the front surface 11 without generation of the thinning and the dishing. Accordingly, it is possible to planarize the front surface 11 and the rear surface 12 of the SiC wafer 10 with high accuracy.

The planarization of the rear surface 12 of the SiC wafer 10 leads to removal of a portion of the trench filling layer 14, the portion extending to the rear surface 12. Thereby, it is possible to improve accuracy of planarization of the rear surface 12, and consequently, it is possible to improve accuracy of planarization of the front surface 11.

Moreover, since the front surface 11 of the SiC wafer 10 is planarized parallel to the planarized rear surface 12, it is not required to measure a condition of the front surface 11. It is possible to achieve an efficient and short-time planarization.

Second Embodiment

In the first embodiment, explanation is given on a case where the surface of the trench filling layer 14 of the element structure is planarized, wherein the element structure is provided by forming the trench 13 on the front surface 11 side of the SiC wafer 10 and by forming the trench filling layer 14 in the trench 13. In the present embodiment, explanation is given on a case where a surface of another element structure is grinded or polished, wherein the another element structure is provided by forming an electrode or the like on a surface of the SiC wafer and by forming a protection film on the electrode or the like.

Figure 5:
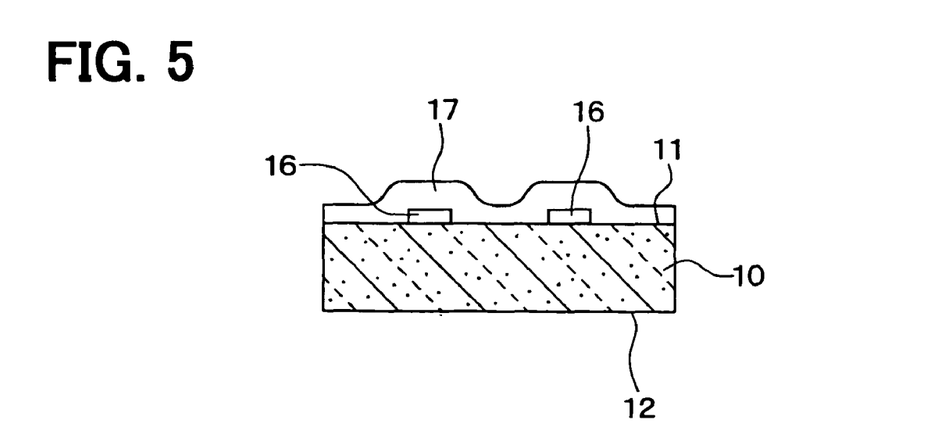
FIG. 5 is a cross sectional diagram illustrating a manufacturing process of a silicon carbide semiconductor apparatus in accordance with a second embodiment.

FIG. 5 is a cross sectional diagram illustrating a manufacturing process of a silicon carbide semiconductor apparatus according to the present embodiment. As shown in FIG. 5, a pattern of a line 16 is formed on the front surface 11 of the SiC wafer 10, and a protection film 17 including a nitride film is formed so as to cover the line 16. A surface of the protection film 17 has a step originating from a step due to the line 16 and has irregularities.

In the present disclosure, a structure formed on the front surface 11 of the SiC wafer 10, which is for example the line 16 or the protection film 17, corresponds to an element structure.

Subsequent processes for planarizing the front surface 11 and the rear surface 12 of the SiC are similar to those according to the first embodiment. That is, the rear surface 12 is planarized in such a manner that the rear surface 12 of the SiC wafer 10 is grinded or polished, like a process shown in FIG. 1B. After planarizing the rear surface 12, the front surface 11 of the SiC wafer 10 is grinded and polished with reference to the rear surface 12 of the SiC wafer 10, and thereby, the front surface 11 is planarized, like a process shown in FIG. 2A.

As described above, the method according to the first embodiment makes it possible to planarize the front surface 11 and the rear surface of the SiC wafer that has the line 16 and the protection film 17 as the element structure.

Other Embodiments

In the above embodiment, explanation is given on flattening the trench filling layer 14 formed in the SiC wafer 10. The method according to the above embodiments can be applied to a case where a hard substance, which is for example sapphire, diamond or the like, is planarized The above method can be applied to a wafer manufacturing process. It is possible to provide a high-precision SiC wafer 10.

In the above embodiments, the rear surface 12 of the SiC wafer 10 is grinded or polished with reference to the front surface 11. Alternatively, a protection tape may be attached to the front surface 11 of the SiC wafer 10 to protect the front surface 11. More specifically, a protection tape having adhesive power may be prepared, and an SiC wafer may be fixed to the protection tape. One example of such a protection film is as follows. A base material is thin. The protection tape can absorb a step on the front surface 11 of the SiC wafer 10 while an adhesive layer is protecting the front surface 11 of the SiC wafer 10. A back grind tape may be used as such a protection tape. A UV tape that is easy to be peeled off may be also used as such a protection tape.

The protection tape is attached to the SiC wafer so that the front surface 11 of the SiC wafer 10 faces an adhesive surface of the protection tape. The protection tape is fixed to a table (not shown). The table has a flat surface, on which the protection tape is placed. Thereby, the protection tape is located between the SiC wafer 10 and the flat surface.

Then, like the process shown in FIG. 1B, the rear surface 12 of the SiC wafer 10 is grinded or polished in such a manner that the grinder having a cylindrical shape is rotated and moved.

When an SiC wafer is so large that the protection tape or the like is not required, it is possible to planarize the rear surface 12 of the SiC wafer 10 without using the protection tape, as described in the above embodiments. It is needless to mention that, when an SiC wafer 10 is not large, it is possible to grind or polish the SiC wafer without using the protection tape, as shown in FIGS. 1A to 1C, 2A, and 2B. When high accuracy grinding or high accuracy polishing is carried out, it may be better not to use the protection tape.

In the above embodiments, the front surface 11 of the SiC wafer 10 is grinded and polished. Alternatively, the front surface 11 of the SiC wafer 10 may only be grinded. The rear surface 12 of the SiC wafer may be grinded and polished, or may be grinded only.

In the above embodiments, when the front surface 11 of the SiC wafer 10 is polished, the front surface 11 is polished by CMP. Alternatively, the damaged layer may be removed from the front surface 11 of the SiC wafer 10 by reactive ion etching (RIE).

In the first embodiment, the element structure includes the trench 13, the trench filling layer 14 and the groove 15. In the second embodiment, the element structure includes the line 16 and the protection film 17. The element structure is not limited to the above-described structures. The element structure may be another structure, which is caused by parts required to provide a semiconductor element.

The above disclosure has the following aspects. A method for manufacturing a silicon carbide semiconductor apparatus includes: preparing a semiconductor substrate 10 made of silicon carbide, having a plate shape, and having a front surface and a rear surface; forming an element structure 13-17 on a front surface 11 side of the semiconductor substrate 10; placing the semiconductor substrate 10 on a table having a flat surface so that the front surface 11 of the semiconductor substrate 10 faces the flat surface of the table, after the element structure 13-17 is formed; grinding or polishing the rear surface 12 of the semiconductor substrate 10 in a direction parallel to the flat surface of the table; grinding and polishing the front surface 11 of the semiconductor substrate 10 in a direction parallel to the rear surface 12 of the semiconductor substrate 10 after the rear surface 12 of the semiconductor substrate 10 is grinded or polished.

According to the above method, in order to grind or polish the rear surface 12 of the semiconductor substrate 10 before planarizing the front surface 11 of the semiconductor substrate 10 in which the element structure 13-17 is formed, it is possible to firstly planarize the rear surface 12 of the semiconductor substrate 10. Then, the front surface 11 of the semiconductor substrate 10 is planarized with reference to the planarized rear surface 12. Thereby, it is possible to planarize the front surface 11 of the semiconductor substrate 10 with respect to the rear surface 12, that is, with respect to a flat plane. That is, even when a surface of the element structure 13-17 has irregularities, it is possible to planarize the surface of the element structure 13-17 with respect to the rear surface 12. Accordingly, it is possible to uniformly planarize the front surface 11 and the rear surface 12 of the semiconductor substrate 10.

By firstly grinding the rear surface 12 of the semiconductor substrate 19 with reference to the flat surface, it is possible to remove an unwanted film that is formed in a device process and that is formed so as to extend to the rear surface 12 of the semiconductor substrate 10 in forming the element structure 13-17 on the front surface 11 side of the semiconductor substrate 10. Therefore, it is possible to planarize the rear surface 12 with high accuracy.

Even if a step caused by the element structure 13-17 exists on the front surface 11 in grinding and polishing the front surface 11 of the semiconductor substrate 10, it is possible to grind and polish the front surface 11, so that the step is eliminated. That is, it is possible to grind and polish the front surface 11 of the semiconductor substrate 10 with respect to the rear surface 12 of the semiconductor substrate 10, so that the step is eliminated. Through the above manners, it is possible to planarize the front surface 11 and the rear surface 12 of the semiconductor substrate 10 with high accuracy without thinning or dishing.

In the above aspect, the grinding and polishing of the front surface 11 of the semiconductor substrate 10 may includes: grinding the front surface 11 of the semiconductor substrate 10 by using super-fine abrasive grains to planarize the front surface 11 of the semiconductor substrate 10; and polishing the front surface 11 of the semiconductor substrate 10 by chemical mechanical polishing, and thereby, removing a damaged layer of the front surface 11 of the semiconductor substrate 10 after the front surface 11 of the semiconductor substrate 10 is grinded by using super-fine abrasive grains.

The use of the super-fine abrasive grains enables to grind the front surface 11 of the semiconductor substrate 10 so that the step on the front surface 11 of the semiconductor substrate 10 is mechanically eliminated. A CMP technique, which includes a chemical process, is applied after that. Thereby, it is possible to remove a damaged layer on the front surface 11 of the semiconductor substrate 10. It is possible to planarize the front surface 11 of the semiconductor substrate 10 with high accuracy.

Alternatively, the grinding and polishing of the front surface 11 of the semiconductor substrate 10 may includes: grinding the front surface 11 of the semiconductor substrate 10 by using super-fine abrasive grains to planarize the front surface 11 of the semiconductor substrate 10; and removing a damaged layer of the front surface 11 of the semiconductor substrate 10 by reactive ion etching after the front surface 11 of the semiconductor substrate 10 is grinded by using the super-fine abrasive grains.

While the invention has been described above with reference to various embodiments thereof, it is to be understood that the invention is not limited to the above described embodiments and construction. The invention is intended to cover various modification and equivalent arrangements. In addition, while the various combinations and configurations described above are contemplated as embodying the invention, other combinations and configurations, including more, less or only a single element, are also contemplated as being within the scope of embodiment.

What is claimed is:

1. A method for manufacturing a silicon carbide semiconductor apparatus, the method comprising:
   preparing a semiconductor substrate made of silicon carbide, having a plate shape, and having a front surface and a rear surface;
   forming an element structure on a front surface side of the semiconductor substrate;
   placing the semiconductor substrate, after the forming of the element structure, on a table having a flat surface so that the front surface of the semiconductor substrate faces the flat surface of the table;
   grinding or polishing the rear surface of the semiconductor substrate in a direction parallel to the flat surface of the table;
   grinding and polishing the front surface of the semiconductor substrate in a direction parallel to the rear surface of the semiconductor substrate after the grinded or polishing of the rear surface of the semiconductor substrate; wherein
   grinding and polishing of the front surface of the semiconductor substrate includes:
      grinding the front surface of the semiconductor substrate by using super-fine abrasive grains to planarize the front surface of the semiconductor substrate; and
      polishing the front surface of the semiconductor substrate by chemical mechanical polishing, and thereby, removing a damaged layer of the front surface of the semiconductor substrate after the grinding of the front surface of the semiconductor substrate by using the super-fine abrasive grains.

2. A method for manufacturing a silicon carbide semiconductor apparatus, the method comprising:
   preparing a semiconductor substrate made of silicon carbide, having a plate shape, and having a front surface and a rear surface;
   forming an element structure on a front surface side of the semiconductor substrate;
   placing the semiconductor substrate, after the forming of the element structure, on a table having a flat surface so that the front surface of the semiconductor substrate faces the flat surface of the table;
   grinding or polishing the rear surface of the semiconductor substrate in a direction parallel to the flat surface of the table;
   grinding and polishing the front surface of the semiconductor substrate in a direction parallel to the rear surface of the semiconductor substrate after the grinded or polishing of the rear surface of the semiconductor substrate; wherein
      grinding and polishing of the front surface of the semiconductor substrate includes:
         grinding the front surface of the semiconductor substrate by using super-fine abrasive grains to planarize the front surface of the semiconductor substrate; and
         removing a damaged layer of the front surface of the semiconductor substrate by reactive ion etching after the grinding of the front surface of the semiconductor substrate by using the super-fine abrasive grains.

3. A method for manufacturing a silicon carbide semiconductor apparatus, the method comprising:
   preparing a semiconductor substrate made of silicon carbide, having a plate shape, and having a front surface and a rear surface;
   forming an element structure on a front surface side of the semiconductor substrate;
   placing the semiconductor substrate, after the forming of the element structure, on a table having a flat surface so that the front surface of the semiconductor substrate faces the flat surface of the table;
   grinding or polishing the rear surface of the semiconductor substrate in a direction parallel to the flat surface of the table;
   grinding and polishing the front surface of the semiconductor substrate in a direction parallel to the rear surface of the semiconductor substrate after the grinded or polishing of the rear surface of the semiconductor substrate;
   forming a semiconductor device on the semiconductor substrate; and
   dividing the semiconductor substrate into a plurality of chips to form a plurality of silicon carbide semiconductor apparatuses.

4. A method for manufacturing a silicon carbide semiconductor apparatus, the method comprising:
   preparing a semiconductor substrate made of silicon carbide, having a plate shape, and having a front surface and a rear surface;
   forming an element structure on a front surface side of the semiconductor substrate;
   placing the semiconductor substrate, after the forming of the element structure, on a table having a flat surface so that the front surface of the semiconductor substrate faces the flat surface of the table;
   grinding or polishing the rear surface of the semiconductor substrate in a direction parallel to the flat surface of the table;
   grinding and polishing the front surface of the semiconductor substrate in a direction parallel to the rear surface of the semiconductor substrate after the grinded or polishing of the rear surface of the semiconductor substrate; wherein
   grinding or polishing of the rear surface of the semiconductor substrate includes:
      removing a film located on the rear surface, wherein the film is incidentally formed on the rear surface in the forming of the element structure on the front surface side of the semiconductor substrate.

5. A method for manufacturing a silicon carbide semiconductor apparatus, the method comprising:
   preparing a semiconductor substrate made of silicon carbide, having a plate shape, and having a front surface and a rear surface:,
   forming an element structure on a front surface side of the semiconductor substrate;
   placing the semiconductor substrate, after the forming of the element structure, on a table having a flat surface so that the front surface of the semiconductor substrate faces the flat surface of the table;
   grinding or polishing the rear surface of the semiconductor substrate in a direction parallel to the flat surface of the table;
   grinding and polishing the front surface of the semiconductor substrate in a direction parallel to the rear surface of the semiconductor substrate after the grinded or polishing of the rear surface of the semiconductor substrate; wherein
   forming the element structure includes:

forming a trench in the front surface of the semiconductor substrate; and forming a trench filling layer that fills in the trench.

6. A method for manufacturing a silicon carbide semiconductor apparatus, the method comprising:

preparing a semiconductor substrate made of silicon carbide, having a plate shape, and having a front surface and a rear surface;

forming an element structure on a front surface side of the semiconductor substrate;

placing the semiconductor substrate, after the forming of the element structure, on a table having a flat surface so that the front surface of the semiconductor substrate faces the flat surface of the table;

grinding or polishing the rear surface of the semiconductor substrate in a direction parallel to the flat surface of the table;

grinding and polishing the front surface of the semiconductor substrate in a direction parallel to the rear surface of the semiconductor substrate after the grinded or polishing of the rear surface of the semiconductor substrate; wherein forming the element structure includes:
  patterning a line element on the front surface of the semiconductor substrate; and
  forming a protection film that covers the line element.

7. A method for manufacturing a silicon carbide semiconductor apparatus, the method comprising:

preparing a semiconductor substrate made of silicon carbide, having a plate shape, and having a front surface and a rear surface;

forming an element structure on a front surface side of the semiconductor substrate;

placing the semiconductor substrate, after the forming of the element structure, on a table having a flat surface so that the front surface of the semiconductor substrate faces the flat surface of the table;

grinding or polishing the rear surface of the semiconductor substrate in a direction parallel to the flat surface of the table;

grinding and polishing the front surface of the semiconductor substrate in a direction parallel to the rear surface of the semiconductor substrate after the grinded or polishing of the rear surface of the semiconductor substrate; wherein the element structure has an irregular surface; and grinding and polishing of the front surface of the semiconductor substrate flattens the irregular surface of the element structure.

8. A method for manufacturing a silicon carbide semiconductor apparatus, the method comprising:

preparing a semiconductor substrate made of silicon carbide, having a plate shape, and having a front surface and a rear surface;

forming an element structure on a front surface side of the semiconductor substrate;

placing the semiconductor substrate, after the forming of the element structure, on a table having a flat surface so that the front surface of the semiconductor substrate faces the flat surface of the table;

grinding or polishing the rear surface of the semiconductor substrate in a direction parallel to the flat surface of the table;

grinding and polishing the front surface of the semiconductor substrate in a direction parallel to the rear surface of the semiconductor substrate after the grinded or polishing of the rear surface of the semiconductor substrate; wherein the front surface of the semiconductor substrate has a step originating form the element structure; and grinding and polishing of the front surface of the semiconductor substrate flattens the step of the front surface of the semiconductor substrate.

9. A method for manufacturing a silicon carbide semiconductor apparatus, the method comprising:

preparing a semiconductor substrate made of silicon carbide, having a plate shape, and having a front surface and a rear surface;

forming an element structure on a front surface side of the semiconductor substrate;

placing the semiconductor substrate, after the forming of the element structure, on a table having a flat surface so that the front surface of the semiconductor substrate faces the flat surface of the table;

grinding or polishing the rear surface of the semiconductor substrate in a direction parallel to the flat surface of the table;

grinding and polishing the front surface of the semiconductor substrate in a direction parallel to the rear surface of the semiconductor substrate after the grinded or polishing of the rear surface of the semiconductor substrate; wherein placing the semiconductor substrate on the table includes:
  pasting a protection tape on the front surface of the semiconductor substrate to protect the front surface, so that the protection tape is located between the flat surface of the table and the front surface of the semiconductor substrate.

10. A method for manufacturing a silicon carbide semiconductor apparatus, the method comprising:

preparing a semiconductor substrate made of silicon carbide, having a plate shape, and having a front surface and a rear surface;

forming an element structure on a front surface side of the semiconductor substrate;

placing the semiconductor substrate, after the forming of the element structure, on a table having a flat surface so that the front surface of the semiconductor substrate faces the flat surface of the table;

grinding or polishing the rear surface of the semiconductor substrate in a direction parallel to the flat surface of the table;

grinding and polishing the front surface of the semiconductor substrate in a direction parallel to the rear surface of the semiconductor substrate after the grinded or polishing of the rear surface of the semiconductor substrate;

dividing the semiconductor substrate into a plurality of chips after the grinding and polishing of the front surface of the semiconductor substrate, wherein:

forming the element structure includes forming a trench in the front surface of the semiconductor substrate;

forming the element structure further includes forming a trench filling layer so as to fill in the trench;

placing the semiconductor substrate on the table includes pasting a protection tape on the front surface of the semiconductor substrate to protect the front surface so that the protection tape is located between the flat surface of the table and the front surface of the semiconductor substrate;

grinding or polishing of the rear surface of the semiconductor substrate includes removing an film on the rear surface, wherein the film is incidentally formed on the rear surface in forming the element structure on the front surface side of the semiconductor substrate;

grinding and polishing of the front surface of the semiconductor substrate includes grinding the front surface of the semiconductor substrate by using super-fine abrasive grains to planarize the front surface of the semiconductor substrate;

grinding and polishing of the front surface of the semiconductor substrate further includes polishing the front surface of the semiconductor substrate by one of chemical mechanical polishing or reactive ion etching, and thereby, removing a damaged layer of the front surface of the semiconductor substrate after the front surface of the semiconductor substrate is grinded; and grinding and polishing of the front surface of the semiconductor substrate flattens a step of the front surface of the semiconductor substrate, the step being originating form the element structure.

11. The method according to claim 4, wherein the film is formed by epitaxial growth.

* * * * *